United States Patent [19]

Culp

[11] Patent Number: 4,736,132

[45] Date of Patent: Apr. 5, 1988

[54] PIEZOELECTRIC DEFORMABLE MIRRORS AND GRATINGS

[75] Inventor: Gordon W. Culp, Van Nuys, Calif.

[73] Assignee: Rockwell International Corporation, El Segundo, Calif.

[21] Appl. No.: 96,880

[22] Filed: Sep. 14, 1987

[51] Int. Cl.[4] .............................................. H01L 41/08
[52] U.S. Cl. ..................................... 310/333; 310/328; 350/487; 350/632
[58] Field of Search ................ 310/323, 328, 330–333; 350/486, 487, 632, 636, 637, 611, 6.6

[56] References Cited

U.S. PATENT DOCUMENTS

| | | | |
|---|---|---|---|
| 3,202,846 | 8/1965 | Ballato et al. | 310/9.7 |
| 3,487,239 | 12/1969 | Schafft | 310/8.5 |
| 3,558,351 | 1/1971 | Foster | 117/201 |
| 3,735,161 | 5/1973 | Perkins et al. | 310/9.5 |
| 3,904,274 | 9/1975 | Feinleib | 310/328 X |
| 4,087,715 | 5/1978 | Myer | 310/328 X |
| 4,128,616 | 12/1978 | Coldren et al. | 310/328 |
| 4,160,184 | 7/1979 | Ljung | 310/328 |
| 4,438,364 | 3/1984 | Morison | 310/328 |
| 4,523,120 | 6/1985 | Assard et al. | 310/333 X |
| 4,533,219 | 8/1985 | Aldrich | 350/487 |
| 4,584,590 | 4/1986 | Fischbeck | 346/140 |

OTHER PUBLICATIONS

K. D. Price et al., "HDM Refurbishment Program" Hughes Aircraft Co. Final Report No. AFWI-TR-84-146.

M. Born & E. Wolf, "Principles of Optics", Pergamon Press, 1959, pp. 406–411.

T. Ytsunomiya & H. Sato, "Electrically Deformable Echelette Grating and its Application to Tunable Laser Resonator", Electronics and Communications in Japan, vol. 63-C, No. 10, 1980, pp. 94–100.

"EMRLD Beam Quality Demonstrator Adaptive Optics Systems", Itek Optical Systems Final Report, Mar. 1986.

M. I. Borisov et al., "Principles of the Monolithic Crystal Transformer (MCT)" Comptes rendus de l'Academie bulgare des Sciences, Tome 31, No. 2, 1978, pp. 167–169.

R. E. Aldrich et al., "High Bandwidth/Fine Resolution Deformable Mirrors" Itek Optical Systems Final Report No. AFWL-TR-81-6, Jun. 1981.

S. A. Kororowski, "Analysis of Adaptive Optical Elements Made From Piezoelectric Bimorphs", Hughes Research Laboratories, J. Opt. Soc. Am., vol. 69, No. 1, Jan. 1979.

*Primary Examiner*—Mark O. Budd
*Attorney, Agent, or Firm*—H. Fredrick Hamann; Harry B. Field; Lawrence N. Ginsberg

[57] ABSTRACT

An apparatus and method for rapidly and accurately positioning an optical surface comprises at least one piezoelectric element 10 with an optical surface 16 located thereon and means 12,30 for applying an electric field to the piezoelectric element 10. The piezoelectric element 10 is piezoelectrically polarized along a first axis and the electric field is supplied along a second axis perpendicular to the first axis. Thus, piezoelectric shear deformation of the piezoelectric element occurs and there is rotation of the optical surface 16 about a third axis which is perpendicular to both the first and second axes. The deformation is sufficient to alter the direction of incident radiation and to alter the direction and distribution of diffracted incident radiation after interaction with the optical surface 16. Varying the magnitude of the electric field alters the magnitude of the deformation thereby accurately positioning the optical surface 16.

20 Claims, 3 Drawing Sheets

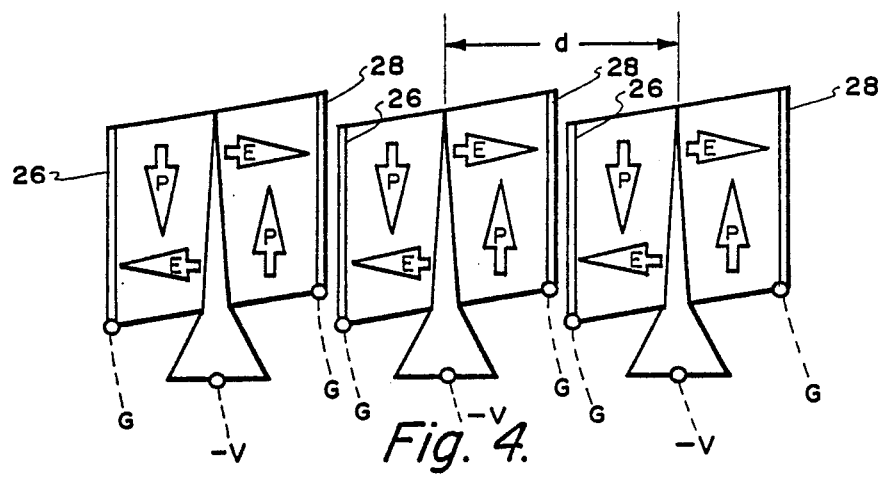
Fig. 4.
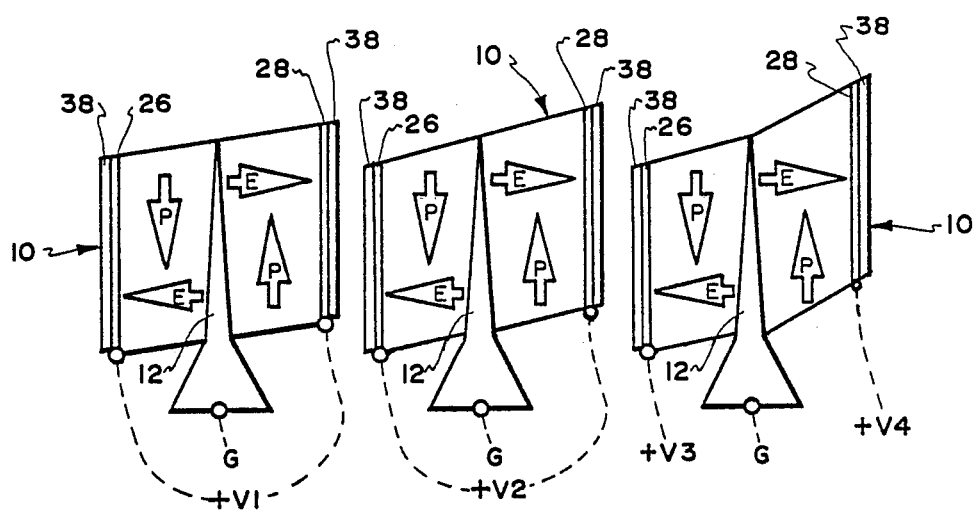
Fig. 5.
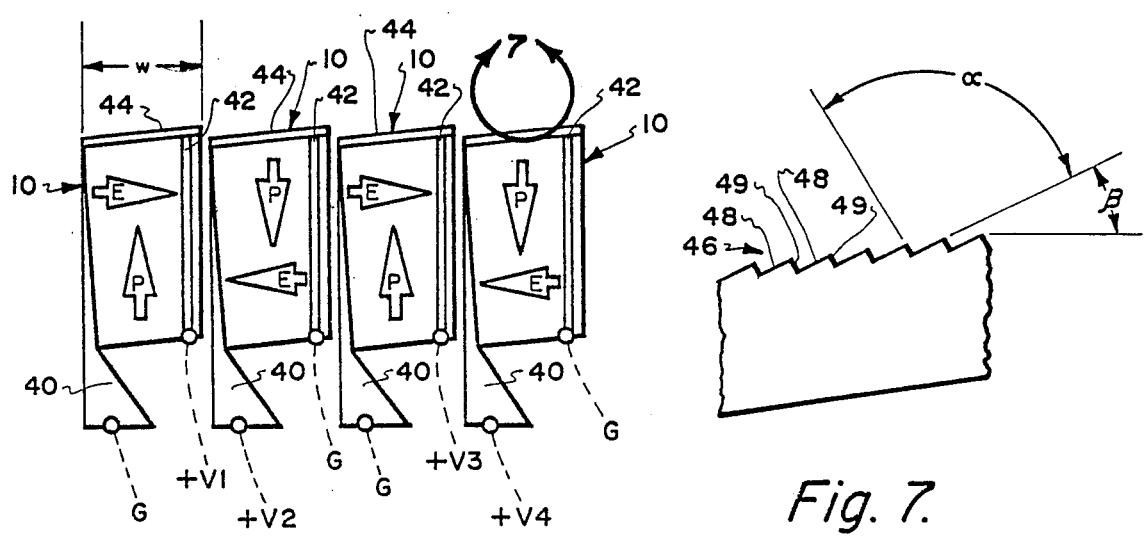
Fig. 6.
Fig. 7.

PIEZOELECTRIC DEFORMABLE MIRRORS AND GRATINGS

BACKGROUND OF THE INVENTION

1. Field of the Invention

The present invention is directed to electromechanical positioners, and more particularly, to the rapid and precise positioning of optical mirrors and gratings.

2. Description of the Prior Art

Segmented mirrors and diffraction gratings of many kinds are well known and widely used. However, most of the prior art positioning methods utilize piezoelectric length and thickness deformations. For example, Final Report "EMRLD Beam Quality Demonstrator Adaptive Optics System", Itek Optical Systems report no. 86-9396-1, March 1986 describes a deformable mirror which uses 341 extension-mode piezoelectric actuators.

In the paper entitled "Electrically Deformable Echelette Grating and its Application to Tunable Laser Resonator", T. Utsunomiya et al, Electronics and Communications in Japan, Vol. 63-C, No. 10, 1980, an electrically deformable echelette grating is disclosed with diffraction characteristics which can be controlled electrically by shear strain of a piezoelectric material. In that disclosure a large number of piezoelectric shear elements are used, and the elements are bonded together. Rotation by shear of the bonded assemblage disclosed in the Utsunomiya et al reference requires rotation of the entire assemblage thereby precluding rapid angular or linear acceleration.

OBJECTS OF THE INVENTION

Accordingly, a principal object of the invention is to rapidly and accurately rotate and/or translate, an optical element.

Another object of the invention is to alter the direction of light reflected from an optical surface.

Yet another object is to change the blaze angle of an optical diffraction grating to adjust the diffraction efficiency.

Still another object of the invention is to change the spatial period of a diffraction grating.

A further object of the invention is the alignment of optical segments of mirrors or of gratings.

Still a further object is to combine the foregoing attributes in a single device wherein desirable actions are performed with very high speed and precision.

Other objects, advantages and novel features of the present invention will become apparent from the following detailed description of the invention when considered in conjunction with the accompanying drawings.

SUMMARY OF THE INVENTION

In its broadest aspects, the present invention for rapidly and accurately positioning an optical surface comprises at least one piezoelectric element with an optical surface located thereon and means for applying an electric field to the piezoelectric element. The piezoelectric element is piezoelectrically polarized along a first axis and the electric field is applied along a second axis perpendicular to the first axis. Thus, when the electric field is applied, piezoelectric shear deformation of the piezoelectric element occurs and there is rotation of the optical surface about a third axis which is perpendicular to both the first and second axes. The deformation is sufficient to alter the direction of incident radiation and the direction and distribution of diffracted incident radiation after interaction with the optical surface. Varying the magnitude of the electric field alters the magnitude of the deformation thereby accurately positioning the optical surface.

BRIEF DESCRIPTION OF THE DRAWINGS

FIG. 4 is a cross-sectional view of an array of piezoelectric elements.

FIG. 5 is a cross-sectional view of an array of piezoelectric elements illustrating an alternate electrical connection.

FIG. 6 is a cross-sectional view of an array of piezoelectric elements, each piezoelectric element having a support electrode on one side and a surface electrode on the other side.

FIG. 7 is an enlarged view of a blazed grating, taken along line 7 of FIG. 6.

The same elements or parts throughout the figures are designated by the same reference characters.

DETAILED DESCRIPTION OF THE PREFERRED EMBODIMENTS

Figure 1:
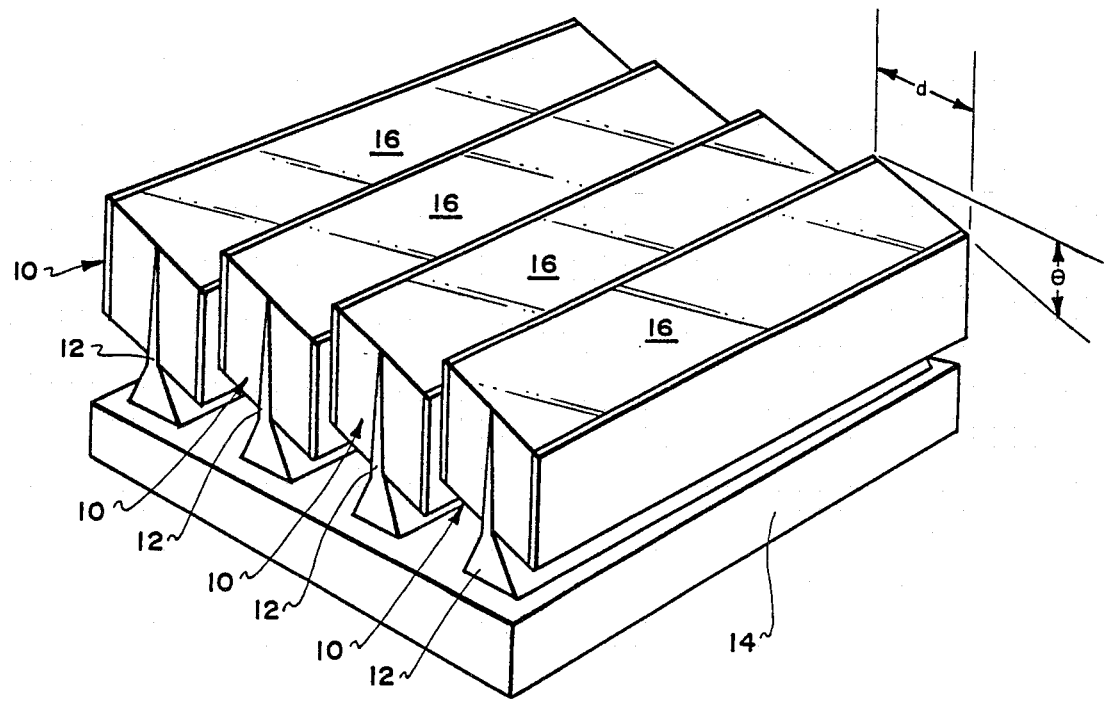
FIG. 1 is a perspective view of an embodiment of the subject apparatus for rapidly and accurately positioning an optical surface.

Referring to FIG. 1, a preferred embodiment of the subject device includes a plurality of piezoelectric elements or strips, each generally designated as 10. Each piezoelectric element 10 is supported by a central electrode 12 which is supported by a base 14. As shown in FIG. 1, the piezoelectric elements 10 are closely spaced by spatial period d and the top or optical surfaces 16 of the piezoelectric elements 10 are parallel.

Figure 2:
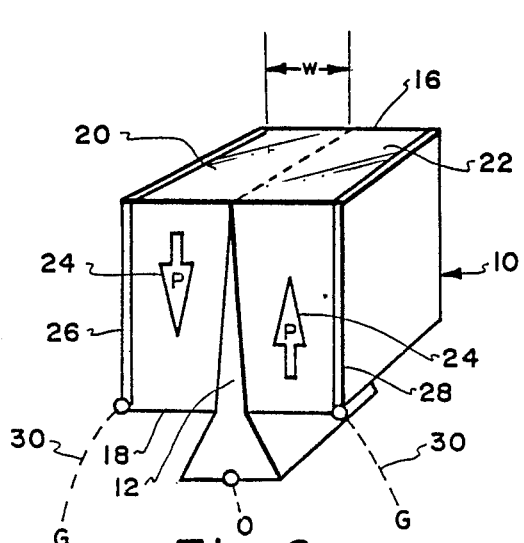
FIG. 2 is a perspective view of a single piezoelectric element in the unenergized state.

FIG. 2 illustrates a single piezoelectric element 10. The piezoelectric element 10 has a rectangular cross-section, the central electrode 12 extends from the base 14 (not shown) through the center of the bottom surface 18 and toward the optical surface 16. Electrode 12 extends the entire length of the piezoelectric element 10 thereby separating the element 10 into two segments or halves, designated as 20 and 22. Each of these halves 20,22 are piezoelectrically polarized along the same axis prior to application of any electric field; however, they are polarized in anti-parallel directions, as shown by arrows 24.

Side electrodes 26,28 extending the length and height of each side of the piezoelectric element 10 are connected by flexible connection means 30 to ground. In the quiescent state shown in FIG. 2, the center electrode 12 is also at zero potential.

Figure 3:
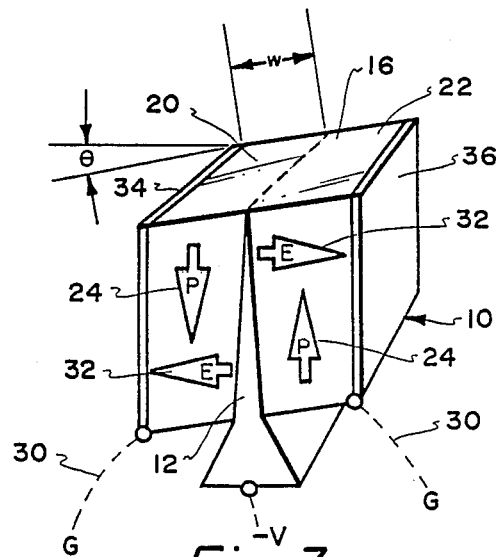
FIG. 3 illustrates the piezoelectric element of FIG. 2 in an energized state.

In FIG. 3, a negative electrical potential, $-V$, is applied to the center electrode 12. Thus, electric fields E are established, as illustrated by arrows 32, which are in opposite directions along an axis which is perpendicular to the axis of piezoelectric polarization. The electric field E is equal to $-V/W$, where W is the width of a half 20 or 22. Application of this electrical potential causes shear deformation of the piezoelectric element 10. The optical surface 16 and the bottom surface 18 rotate at an angle $\theta$ while the two side faces 34,36 translate with respect to each other. Application of a positive electrical potential reverses the sense of deformation in the two halves 20,22. Thus, the bipolar electric drive allowed by shear operation achieves twice the deformation at a given magnitude of potential than the deformation due to the extension or thickness modes of piezoelectric deformation. Application of the opposite electrical polarity to the two havles 20,22 has no effect on the magnitude or direction of the piezoelectric polarization therein.

The parallelapipedal dimensions of the piezoelectric element 10 do not change during shear deformation. The magnitude of the deformation $\theta$ is given by $d_{15}E$, where $d_{15}$ is the piezoelectric shear coefficient. The deformation occurs symmetrically about the plane of the center electrode.

As an example, a strip-wise segmented steering mirror in which each strip has a cross section of 1 mm by 1 mm will easily achieve an angle of $\pm 1$ mrad at 10,000 HZ when a potential of $\pm 1000$ volts is applied. Angular amplitude and frequency are retained regardless of the area which is covered with such strips.

In FIG. 4, an array of piezoelectric elements of FIG. 3 are shown closely spaced and parallel. Side surface electrodes 26,28 being permanently electrically grounded, may be spaced as closely together as desired, short of causing frictional interference with translatory motion, without causing electrical interference therebetween.

The embodiment shown in FIG. 4 may be utilized as a segmented mirror or a diffraction grating. If the ratio of the optical wavelength of incident light to the spacing d between the piezoelectric elements 10 is large then diffraction grating behavior results. A small ratio results in segmented mirror function.

Referring to FIG. 5, an alternate electrical connection of piezoelectric elements 10 is illustrated. Each central electrode 12 is connected to ground and the electrical potentials applied to the side electrodes 26,28 are varied. Therefore, the shear deformation of each portion of piezoelectric element 10 may be distinct. This allows, for example, use of this apparatus as a deformable cylindrical mirror.

The piezoelectric elements 10 may be closely arranged side by side and the side electrodes may be in electrical contact if the potential difference, for exapmle, V2−V1, between touching electrodes is negligibly small. In practice, any electrical potential difference interferes with the accurate electrical control of piezoelectric deformation, therefore at least one surface electrical insulator 38 is required between adjacent piezoelectric elements 10. A preferred insulator for small potential differences is an electrically non-conductiing chemical conversion layer on the external surface of at least one side surface electrode.

Referring to FIG. 6, an array of piezoelectric elements 10 are shown in which each piezoelectric element 10, instead of having a central electrode, includes a support electrode 40 on one side and a surface electrode 42 on the other side. The potentials alternate as shown in the figure. This arrangement effectively doubles the spatial frequency of the piezoelectric elements 10 over the embodiment illustrated in FIG. 4 and allows greater electrical control of the deformation of the piezoelectric elements 10. The arrangement is advantageous for use as an optical diffraction grating where the spatial period W is approximately equal to or less than the wavelength of interest.

The optical surface may be formed of the same material as the piezoelectric element 10 or it may include an electrically insulating optical substrate 44 which is formed on the piezoelectric material, as shown in FIG. 6. The optical substrate 44 may, for example, be a planar optical mirror, a diffraction grating, or other optical element.

FIG. 7 is an enlarged view of the optical surface of FIG. 6 and illustrates a blazed grating, generally designated 46. The blazed grating 46 contains a plurality of parallel, strip-like elements 48, and adjacent elements 49. Each adjacent pair of elements 48,49 has an included angle $\alpha$ to concentrate diffracted radiation in a desired direction. The degree of concentration is defined as the diffraction efficiency. If the wavelength of light impinging on the grating 46 is changed, the diffraction efficiency is reduced. Efficiency is restored by changing the angles of lie $\beta$ of the elements.

Figure 8:
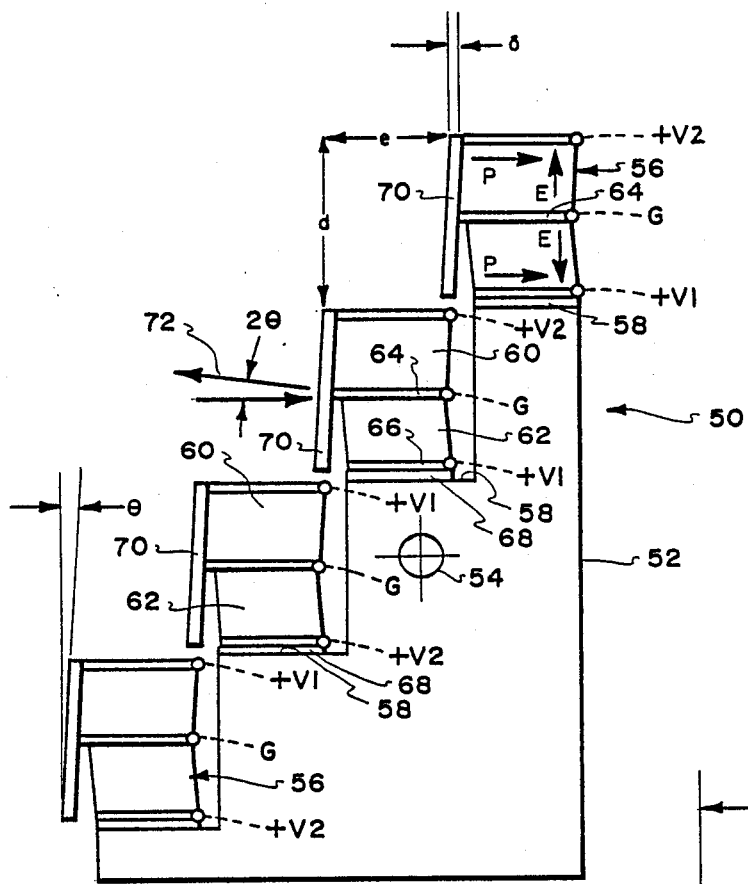
FIG. 8 is a cross-sectional view of an echelle grating utilizing the principles of the present invention.

The foregoing principles may be utilized for construction of a reflective echelle, i.e. a narrow angle, high resolution grating, generally designated as 50 in FIG. 8. The echelle grating illustrated in FIG. 8 is distinguished from the echelette grating discussed in the description of the prior art with respect to the Utsunomiya disclosure. In the echelette grating each diffraction element is formed by the edge of the piezoelectric elements whereas in the echelle grating of FIG. 8 a mirror, many wavelengths in subtense, is attached to each piezoelectric element. Segments of echelette gratings may be attached to each piezoelectric element of the present invention, as shown in FIG. 7. The echelle grating 50 includes a stepped base 52 which is rotatable about an axis 54. A plurality of piezoelectric elements, each generally designated 56, are mounted on respective steps 58 at spatial period d and order distance e. Each piezoelectric element 56 is divided into two halves or segments 60,62 by a center electrode 64. A side surface electrode 66 of each lower segment 62 is mounted to the step 58 but is insulated therefrom by an insulating layer 68. Each center electrode 64 is maintained at zero potential G. The piezoelectric polarization of each segment in each piezoelectric element 56 is in the same direction. Therefore, as shown in FIG. 8, when electrical potential voltage $+V1$ is applied to segment 62, segment 60 moves laterally with respect to the base 52 by distance $\delta$. A planar mirror or other optical element 70 is connected to each upper segment 60 so that when the voltage $+V2$ is applied to segment 60, the optical element 70 rotates through an angle $\theta$ and the reflected light ray 72 is rotated through an angle $2\theta$. Anti-parallel piezoelectric polarization in combination with potentials $-V1$ and $+V2$ cause the same actions.

The piezoelectric elements may be physically and electrically segmented in a lengthwise direction to provide rotation in a direction perpendicular to $\theta$. This allows parallel alignment of each optical element.

Figure 9:
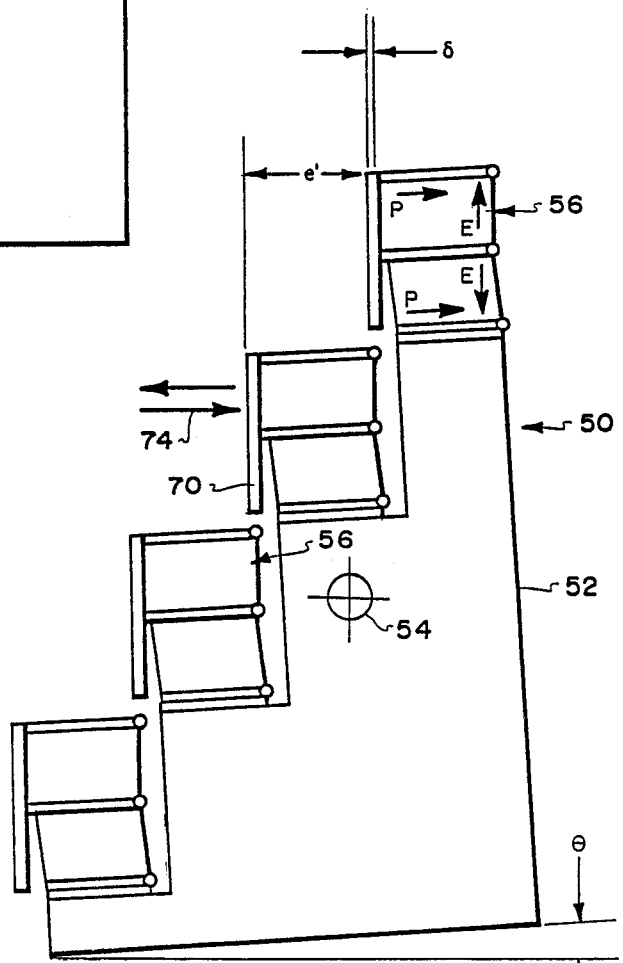
FIG. 9 illustrates the echelle grating of FIG. 8 rotated to cause incident light to be reflected normally.

In FIG. 9, the base 52 of the echelle grating 50 has been rotated through an angle $\theta$ about axis 54 to cause incident light ray 74 to be reflected normally and to adjust the order, i.e. the number of wavelengths of the optical path e' of the echelle. Optical pathlength e' has been shortened from e (the optical pathlength in the FIG. 8 embodiment) by a considerably greater amount than the piezoelectric adjustment range $\delta$. The magnitude of the adjustment is a function of the echelle geometry and the magnitude of rotation $\theta$.

Translation δ remains essentially unchanged after base rotation and the segment 62 is fully operable to adjust e′, although a translation due to deformation of piezoelectric element 62 becomes accompanied by a small component of translation in a direction parallel to the optical plane of element 70.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. An apparatus for rapidly and accurately positioning an optical surface, comprising:
    at least one piezoelectric element;
    an optical surface located on said piezoelectric element for altering the direction of incident acoustic or electromagnetic radiation, said piezoelectric element being piezoelectrically polarized along a first axis; and
    means for applying an electric field to said piezoelectric element along a second axis perpendicular to said first axis for causing piezoelectric shear deformation of said piezoelectric element and rotation of said optical surface about a third axis which is perpendicular to both said first and said second axes, said deformation being sufficient to alter the direction of said incident radiation and to alter the direction and distribution of diffracted incident radiation after interaction with said optical surface;
    wherein varying the magnitude of said electric field alters the magnitude of said deformation thereby accurately positioning said optical surface.

2. The apparatus of claim 1 wherein said first axis is perpendicular to said optical surface.

3. The apparatus of claim 1, wherein said optical surface is a reflective surface.

4. The apparatus of claim 1, wherein said optical surface is a refractive surface.

5. The apparatus of claim 1, wherein said optical surface is at least one segment of a diffractive surface.

6. The apparatus of claim 1, wherein said piezoelectric element has a substantially rectangular cross section in the unenergized state, said piezoelectric element including a bottom surface located on an opposite end of said piezoelectric element from said optical surface, and two side surfaces.

7. The apparatus of claim 6, wherein said means for applying an electric field includes an electrode extending through the approximate center of said bottom surface and into said piezoelectric element toward said optical surface.

8. The apparatus of claim 7, wherein said means for applying an electric field further includes two side electrodes, each located at a respective side surface.

9. The apparatus of claim 6, wherein said means for applying an electric field includes a first electrode extending along one of said side surfaces of said piezoelectric element, and a second electrode extending along the other of said side surfaces.

10. The apparatus of claim 6, including a plurality of closely spaced piezoelectric elements, a side surface of each piezoelectric element located adjacent a side surface of another piezoelectric element, the optical surface of each piezoelectric element being coplaner with the adjacent said optical surfaces when all said elements are unenergized.

11. The apparatus of claim 10, wherein said means for applying an electric field includes a plurality of central electrodes, each central electrode extending through the approximate center of the bottom surface of a respective piezoelectric element and toward the optical surface, each central electrode extending along the length of said piezoelectric element.

12. The apparatus of claim 11, wherein said means for applying an electric field further includes a plurality of side electrodes, each side electrode being located on a respective side surface.

13. The apparatus of claim 12, wherein each of said piezoelectric elements is piezoelectrically polarized in anti-parallel directions on each side of its center electrode.

14. The apparatus of claim 12, further including base support means for supporting said plurality of central electrodes along a common plane.

15. The apparatus of claim 10, further including electrical insulation means located along an outer periphery of said side electrodes to electrically insulate the piezoelectric elements from each other.

16. The apparatus of claim 8, further including a plurality of piezoelectric elements, each piezoelectric element being attached at a first side surface to a different step on a stepped base, each said piezoelectric element being piezoelectrically polarized in a parallel direction on each side of its center electrode, said optical surface comprising a planar mirror being attached to the half of each piezoelectric element located at the second side surface and thereby forming a narrow angle, high resolution, reflective echelle optical grating.

17. The apparatus of claim 16, wherein said stepped base is rotated to affect a change in distance between adjacent said optical surfaces which is larger than the positioning range of said piezoelectric elements.

18. The apparatus of claim 10, wherein said means for applying an electric field includes a plurality of first electrodes, each first electrode extending along one side surface of each piezoelectric element and a plurality of second electrodes, each second electrode extending along the other side surface of each piezoelectric element.

19. The apparatus of claim 18, wherein each said second electrode supports each said piezoelectric element.

20. A method for rapidly and accurately positioning an optical surface, comprising the steps of:
    providing at least one piezoelectric element being piezoelectrically polarized along a first axis, said at least one piezoelectric element having an optical surface for altering the direction of incident acoustic or electromagnetic radiation; and
    applying an electric field to said piezoelectric element along a second axis perpendicular to said first axis for causing piezoelectric shear deformation of said piezoelectric element and rotation of said optical surface about a third axis which is perpendicular to both said first and said second axes, said deformation being sufficient to alter the direction of said incident radiation after interaction with said optical surface;
    wherein varying the magnitude of said electric field alters the magnitude of said deformation thereby accurately positioning said optical surface.

* * * * *